United States Patent
Manabe et al.

(10) Patent No.: US 11,380,586 B2
(45) Date of Patent: Jul. 5, 2022

(54) CUTTING METHOD

(71) Applicants: IWATANI CORPORATION, Osaka (JP); HAMAMATSU PHOTONICS K.K., Shizuoka (JP)

(72) Inventors: Toshiki Manabe, Tokyo (JP); Takehiko Senoo, Amagasaki (JP); Koichi Izumi, Amagasaki (JP); Tadashi Shojo, Amagasaki (JP); Takafumi Ogiwara, Hamamatsu (JP); Takeshi Sakamoto, Hamamatsu (JP)

(73) Assignees: IWATANI CORPORATION, Osaka (JP); HAMAMATSU PHOTONICS K.K., Hamamatsu (JP)

( * ) Notice: Subject to any disclaimer, the term of this patent is extended or adjusted under 35 U.S.C. 154(b) by 141 days.

(21) Appl. No.: 16/632,291

(22) PCT Filed: Jul. 18, 2018

(86) PCT No.: PCT/JP2018/026851
§ 371 (c)(1),
(2) Date: Jan. 17, 2020

(87) PCT Pub. No.: WO2019/017367
PCT Pub. Date: Jan. 24, 2019

(65) Prior Publication Data
US 2020/0365460 A1    Nov. 19, 2020

(30) Foreign Application Priority Data
Jul. 20, 2017  (JP) .............................. JP2017-140871

(51) Int. Cl.
*H01L 21/78*   (2006.01)
*H01L 21/268*  (2006.01)
*H01L 21/3065* (2006.01)

(52) U.S. Cl.
CPC ............ *H01L 21/78* (2013.01); *H01L 21/268* (2013.01); *H01L 21/3065* (2013.01)

(58) Field of Classification Search
CPC ...... B23K 26/53; B23K 26/364; B23K 26/38; H01L 21/3043; H01L 21/268; H01L 21/3065
See application file for complete search history.

(56) References Cited

U.S. PATENT DOCUMENTS

2003/0176069 A1   9/2003  Yuasa et al.
2005/0287846 A1  12/2005  Dozen et al.
(Continued)

FOREIGN PATENT DOCUMENTS

DE   11 2013 002 348 T5   1/2015
JP      2003-273082 A     9/2003
(Continued)

OTHER PUBLICATIONS

International Search Report issued in PCT/JP2018/026851; dated Oct. 16, 2018.
(Continued)

*Primary Examiner* — Julio J Maldonado
*Assistant Examiner* — Stanetta D Isaac
(74) *Attorney, Agent, or Firm* — Studebaker & Brackett PC

(57) ABSTRACT

A cutting method includes: forming a reformed region in a workpiece; and after forming the reformed region in the workpiece, forming a groove in the workpiece along an intended cut line. In the forming a groove, a first dry etching process is performed from a front surface toward a rear surface of the workpiece. After the first dry etching process, a first pressure-reducing process is performed in which the workpiece is placed under an atmosphere of reduced pressure as compared to pressure during the first dry etching (Continued)

process. After the first pressure-reducing process, a second dry etching process is performed from the front surface toward the rear surface of the workpiece.

12 Claims, 12 Drawing Sheets

(56) References Cited

U.S. PATENT DOCUMENTS

| | | |
|---|---|---|
| 2006/0234512 A1 | 10/2006 | Yuasa et al. |
| 2010/0068888 A1 | 3/2010 | Honda et al. |
| 2010/0136766 A1 | 6/2010 | Sakamoto et al. |
| 2012/0077296 A1 | 3/2012 | Yamada et al. |
| 2013/0023076 A1 | 1/2013 | Uchiyama |
| 2013/0059428 A1 | 3/2013 | Arai |
| 2014/0017881 A1* | 1/2014 | Eaton ............... H01L 21/30655 438/463 |
| 2015/0118849 A1 | 4/2015 | Oda et al. |

FOREIGN PATENT DOCUMENTS

| | | |
|---|---|---|
| JP | 2004-359475 A | 12/2004 |
| JP | 2006-040914 A | 2/2006 |
| JP | 2006-049851 A | 2/2006 |
| JP | 2010-073815 A | 4/2010 |
| JP | 2013-055120 A | 3/2013 |
| JP | 2013-522884 A | 6/2013 |
| JP | 2013-254936 A | 12/2013 |
| TW | 201318199 A1 | 5/2013 |
| WO | 2008/146744 A1 | 12/2008 |
| WO | 2011/112823 A2 | 9/2011 |

OTHER PUBLICATIONS

An Office Action mailed by the Korean Intellectual Property Office dated May 27, 2021, which corresponds to Korean Patent Application No. 10-2020-7004266 and is related to U.S. Appl. No. 16/632,291; with English language translation.

An Office Action mailed by Taiwanese Patent Office dated Jul. 13, 2021, which corresponds to Taiwanese Patent Application No. 107124812 and is related to U.S. Appl. No. 16/632,291; with English language translation.

An Office Action issued by the German Patent and Trademark Office dated Apr. 5, 2022, which corresponds to German Patent Application No. 112018003719.3 and is related to U.S. Appl. No. 16/632,291; with English language translation.

* cited by examiner

CUTTING METHOD

TECHNICAL FIELD

The present invention relates to cutting methods, and more particularly to a cutting method for cutting a workpiece in the form of a plate along an intended cut line.

BACKGROUND ART

There is conventionally known a processing method of applying a laser beam while positioning a point of condensation in a workpiece in the form of a plate to thereby form a reformed region, and then performing an etching process on the reformed region. This processing method is described, for example, in Japanese Patent Laying-Open No. 2004-359475 (PTL 1). In the processing method described in this publication, a wet etching process is used as the etching process performed on the reformed region.

CITATION LIST

Patent Literature

PTL 1: Japanese Patent Laying-Open No. 2004-359475

SUMMARY OF INVENTION

Technical Problem

A cutting method is conceivable in which a workpiece such as a semiconductor substrate is cut using the processing method described in the publication above. When chips to be formed from the semiconductor substrate as a workpiece are small in size, it is suitable to employ a dry etching process capable of microfabrication as compared to the wet etching process. When a common dry etching process is used as the etching process performed on the reformed region, a groove formed along an intended cut line has a small width, thus making it difficult for etching gas to enter the groove. This disadvantageously results in a low rate of formation of the groove.

The present invention has been made in view of the problem above, and an object of the present invention is to provide a cutting method by which the rate of formation of a groove along an intended cut line can be increased.

Solution to Problem

A cutting method of the present invention is for cutting a workpiece in a form of a plate along an intended cut line. The cutting method includes: forming a reformed region in the workpiece along the intended cut line, by applying a laser beam while positioning a point of condensation in the workpiece; and after forming the reformed region in the workpiece, forming a groove in the workpiece along the intended cut line. In the forming a groove, a first dry etching process is performed from a front surface toward a rear surface of the workpiece. After the first dry etching process, a first pressure-reducing process is performed in which the workpiece is placed under an atmosphere of reduced pressure as compared to pressure during the first dry etching process. After the first pressure-reducing process, a second dry etching process is performed from the front surface toward the rear surface of the workpiece.

Advantageous Effects of Invention

According to the cutting method of the present invention, the rate of formation of a groove along an intended cut line can be increased.

DESCRIPTION OF EMBODIMENTS

In the following, a cutting method according to an embodiment of the present invention is described with reference to the drawings. Unless otherwise described, the same elements are denoted by the same characters and description thereof will not be repeated.

Figure 1:
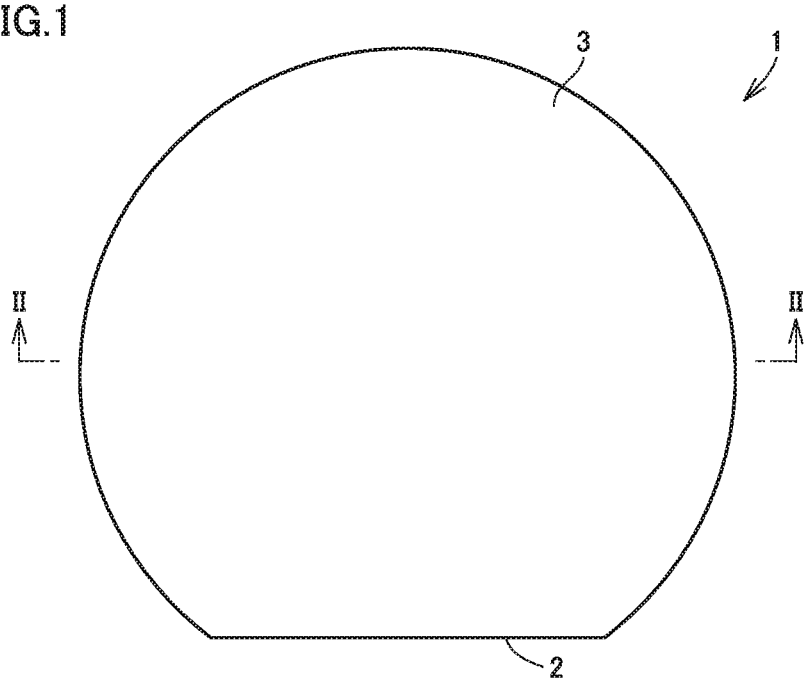
FIG. 1 is a schematic plan view of a workpiece in a cutting method according to an embodiment of the present invention.
Figure 2:
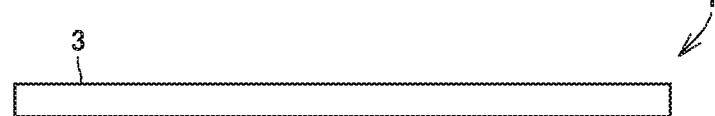
FIG. 2 is a sectional view along the line II-II in FIG. 1.

Referring to FIGS. 1 and 2, a workpiece 1 for the cutting method according to the embodiment of the present invention is prepared. As shown in FIGS. 1 and 2, workpiece 1 is a semiconductor substrate, for example. The following describes the case where workpiece 1 is a semiconductor substrate.

The semiconductor substrate as workpiece 1 is configured to have a substantially disk shape. Workpiece (semiconductor substrate) 1 has an orientation flat 2 provided at its outer circumference. Workpiece (semiconductor substrate) 1 is a silicon (Si) wafer, for example.

A plurality of functional devices (not shown) are provided on a front surface 3 of workpiece (semiconductor substrate) 1. In other words, workpiece (semiconductor substrate) 1 includes a substrate body, and the plurality of functional devices disposed on a front surface of the substrate body. The functional devices are, for example, semiconductor operating layers formed by crystal growth, light-receiving devices such as photodiodes, light-emitting devices such as laser diodes, or circuit elements formed as a circuit. The plurality of functional devices are provided in a matrix in directions parallel to and perpendicular to orientation flat 2 of the semiconductor substrate.

Referring now to FIGS. 3 to 10, the formation of a reformed region in the cutting method according to the embodiment of the present invention is described. First, a laser processing apparatus 100 for use in the formation of the reformed region is described.

Figure 3:
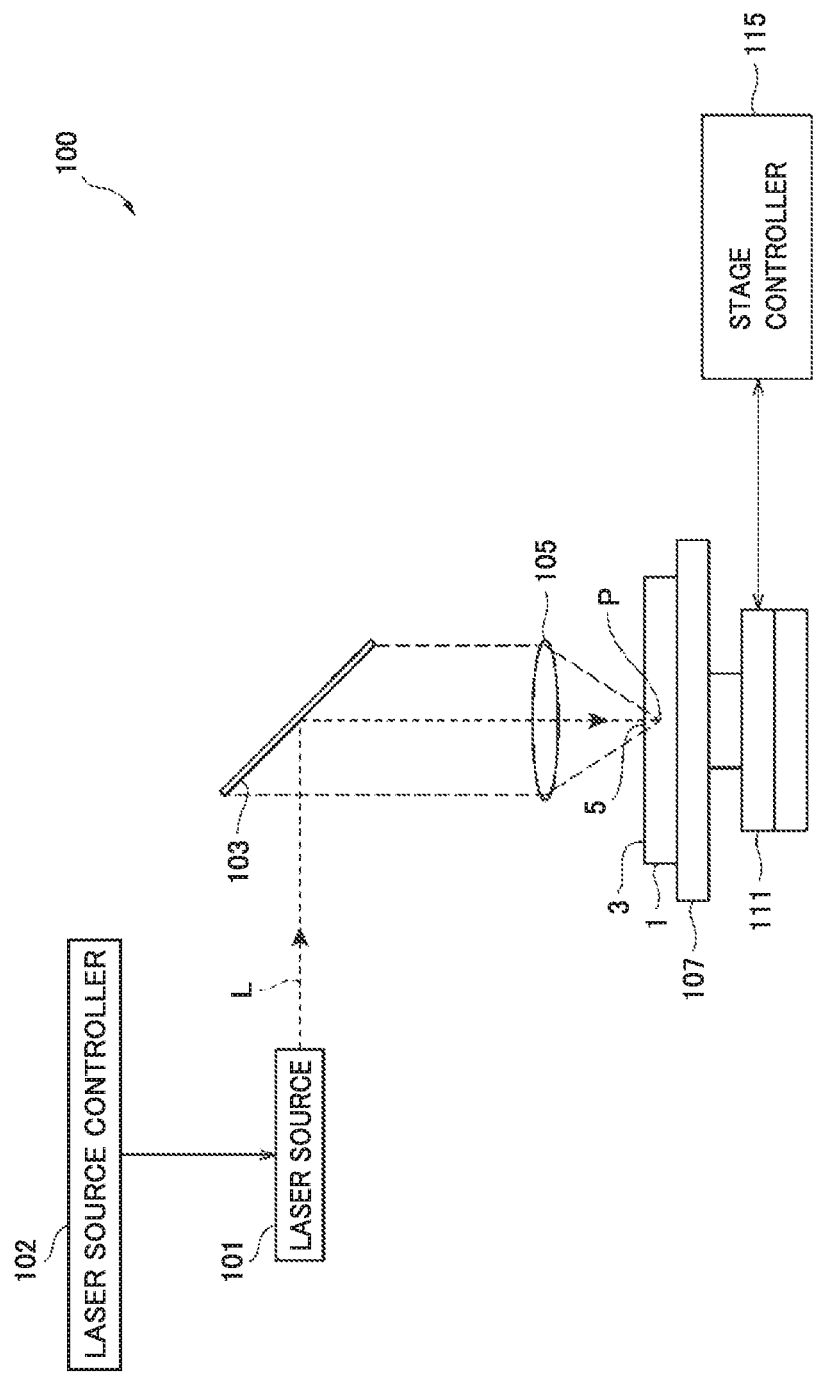
FIG. 3 is a schematic configuration diagram of a laser processing apparatus for use in the formation of reformed regions in the cutting method according to the embodiment of the present invention.

As shown in FIG. 3, laser processing apparatus 100 includes: a laser source 101 to cause pulse oscillation of a laser beam (processing laser beam) L; a dichroic mirror 103 arranged to change the orientation of an optical axis of laser beam L by 90°; and a condenser lens 105 for condensing laser beam L. Laser processing apparatus 100 also includes: a support table 107 for supporting workpiece (semiconductor substrate) 1 irradiated with laser beam L condensed by condenser lens 105; a stage 111 for moving support table 107 in X, Y and Z directions; a laser source controller 102 to control laser source 101 in order to adjust output, pulse width and the like of laser beam L; and a stage controller 115 to control the movement of stage 111.

In this laser processing apparatus 100, laser beam L emitted from laser source 101 is changed in orientation of its optical axis by 90° by dichroic mirror 103, and condensed by condenser lens 105 into workpiece (semiconductor substrate) 1 placed on support table 107. At the same time, stage 111 is moved, causing workpiece (semiconductor substrate) 1 to move along an intended cut line relative to laser beam L. As a result, a reformed region serving as a starting point of cutting is formed in workpiece (semiconductor substrate) 1 along an intended cut line 5. This reformed region is described in detail below.

Figure 4:
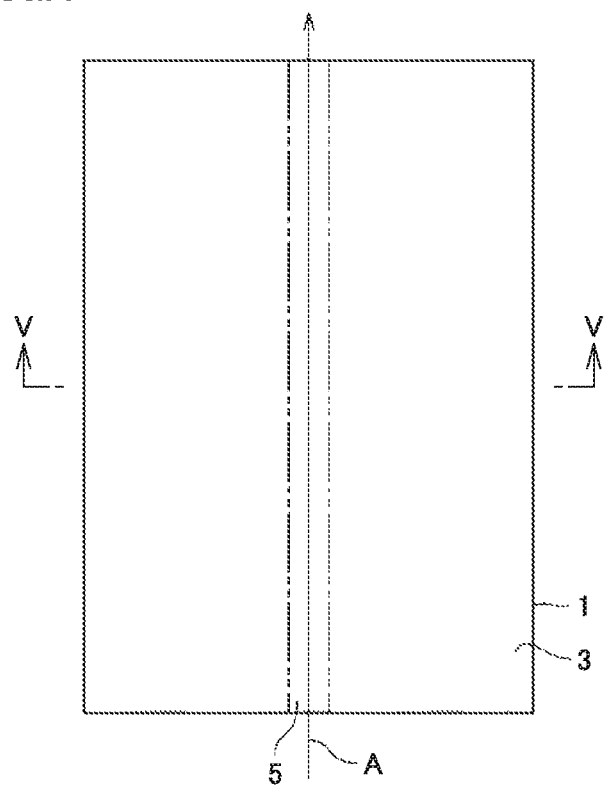
FIG. 4 is a schematic plan view of the workpiece in which the reformed regions are to be formed in the cutting method according to the embodiment of the present invention.
Figure 5:
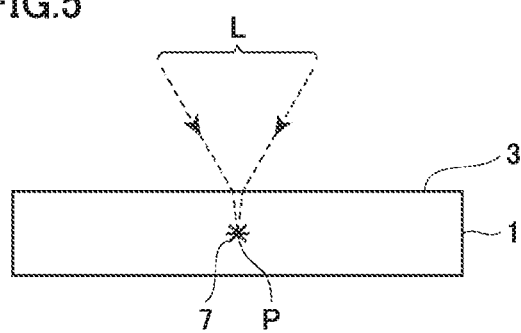
FIG. 5 is a sectional view along the line V-V in FIG. 4.
Figure 6:
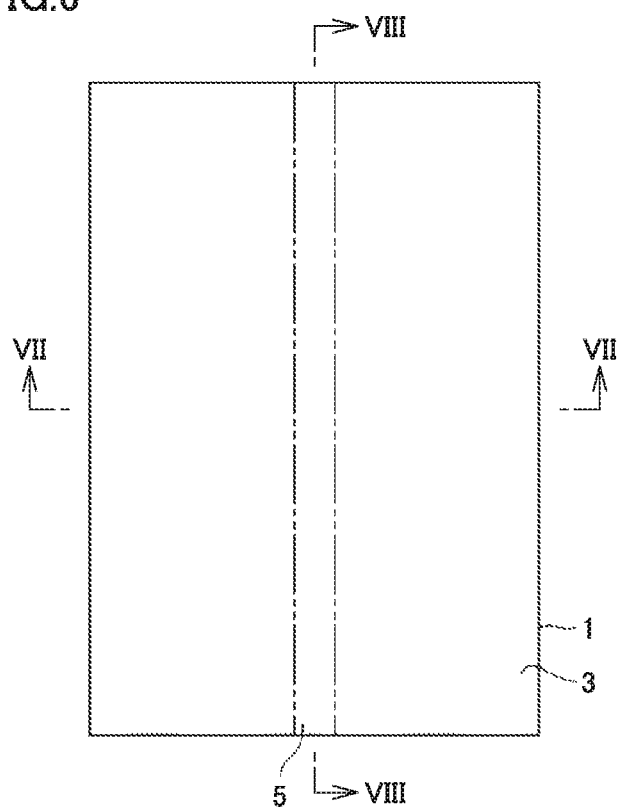
FIG. 6 is a schematic plan view of the workpiece after laser processing in the cutting method according to the embodiment of the present invention.
Figure 7:
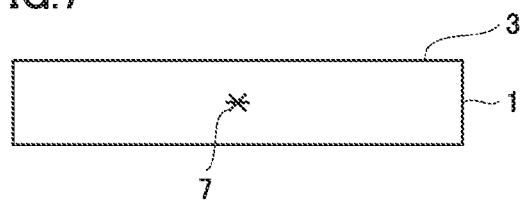
FIG. 7 is a sectional view along the line VII-VII in FIG. 6.
Figure 8:
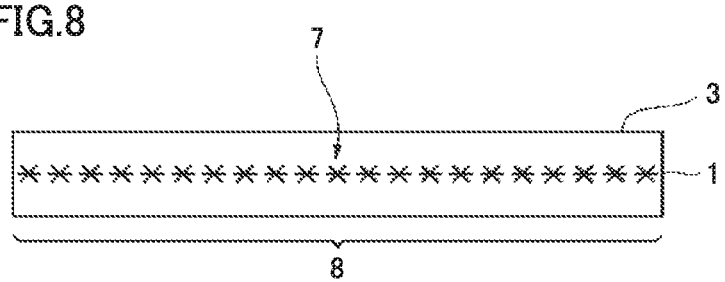
FIG. 8 is a sectional view along the line VIII-VIII in FIG. 6.

As shown in FIG. 4, workpiece (semiconductor substrate) 1 in the form of a plate is provided with intended cut line 5 along which workpiece (semiconductor substrate) 1 is to be cut. Intended cut line 5 is a linearly extending imaginary line. When forming the reformed region within workpiece 1, laser beam L is relatively moved along intended cut line 5 (namely, in the direction of an arrow A in FIG. 4), while a point of condensation P is positioned within workpiece (semiconductor substrate) 1, as shown in FIG. 5. As a result, as shown in FIGS. 6 to 8, a reformed region 7 is formed within workpiece (semiconductor substrate) 1 along intended cut line 5, and reformed region 7 formed along intended cut line 5 serves as a cutting starting point region 8.

It should be noted that point of condensation P is a spot where laser beam L is condensed. Intended cut line 5 may be curved instead of being linear, or may be a line actually drawn on front surface 3 of workpiece 1 instead of being the imaginary line. Reformed region 7 may be formed continuously or intermittently. Reformed region 7 should only be formed at least within workpiece 1. Cracks may originate from reformed region 7, and the cracks and reformed region 7 may be exposed at an outer surface (front surface, rear surface, or outer circumferential surface) of workpiece 1.

Reformed region 7 refers to a region whose density, refractive index, mechanical strength or other physical properties have been altered from those of a surrounding region. Examples include a melt processing region, a crack region, a dielectric breakdown region, a refractive-index-changed region, and also a region having a mixture of these regions.

Referring again to FIG. 3, workpiece (semiconductor substrate) 1 is fixed on support table 107 of laser processing apparatus 100. Then, with front surface 3 of workpiece (semiconductor substrate) 1 as a laser beam incident surface, laser beam L is applied while point of condensation P is positioned within workpiece (semiconductor substrate) 1, and point of condensation P is scanned, by the movement of support table 107, along intended cut lines 5 arranged in a lattice pattern so as to extend through adjacent functional devices. In addition, point of condensation P is scanned on intended cut line 5 along a thickness direction of workpiece (semiconductor substrate) 1.

Figure 9:
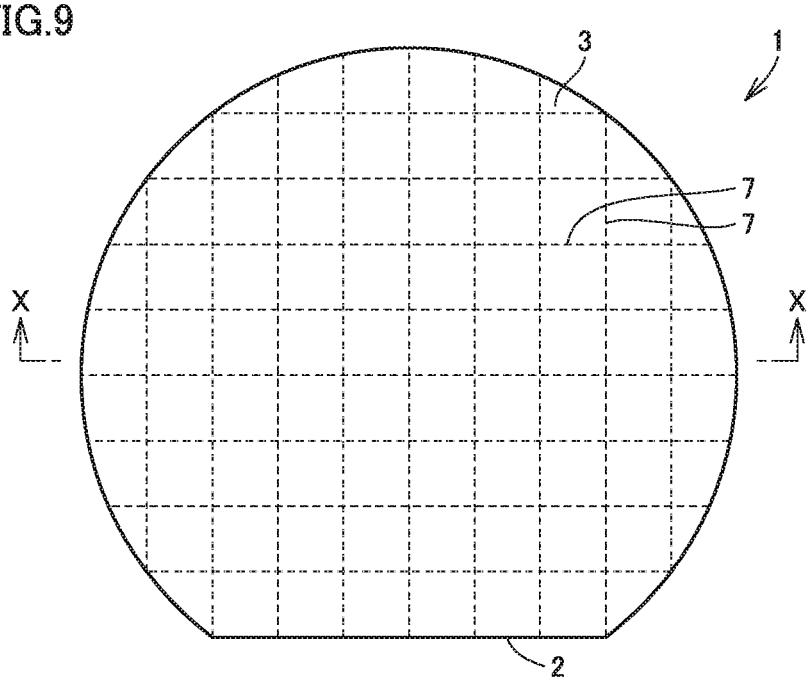
FIG. 9 is a schematic plan view of the workpiece after the reformed regions have been formed in the cutting method according to the embodiment of the present invention.
Figure 10:
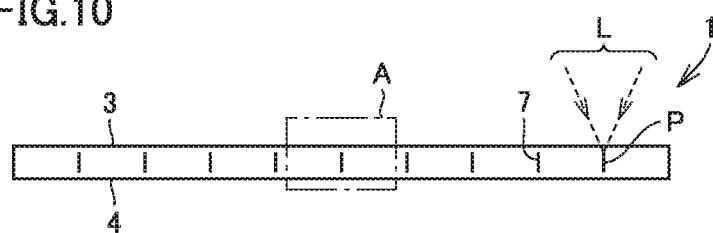
FIG. 10 is a sectional view along the line X-X in FIG. 9.

As a result, as shown in FIG. 9, reformed regions 7 are formed in a lattice pattern in workpiece (semiconductor substrate) 1. Each reformed region 7 is formed within workpiece (semiconductor substrate) 1 from the front surface 3 side to a rear surface 4 side of workpiece (semiconductor substrate) 1, as shown in FIG. 10. In other words, reformed region 7 is formed in the thickness direction of workpiece (semiconductor substrate) 1.

Reformed region 7 may be formed in such a manner that a state of formation of reformed region 7 on the front surface side and a state of formation of reformed region 7 on the rear surface side of workpiece (semiconductor substrate) 1 are substantially identical. In this case, in the thickness direction of workpiece (semiconductor substrate) 1, a state of formation of reformed region 7 from the center of workpiece (semiconductor substrate) 1 to front surface 3 and a state of formation of reformed region 7 from the center to rear surface 4 are substantially identical. In other words, reformed region 7 is formed symmetrically with respect to the center in the thickness direction of workpiece (semiconductor substrate) 1.

Referring now to FIGS. 11 to 19, the formation of a groove 9 in the cutting method according to the embodiment of the present invention is described. First, an etching apparatus 200 for use in the formation of groove 9 is described.

Figure 11:
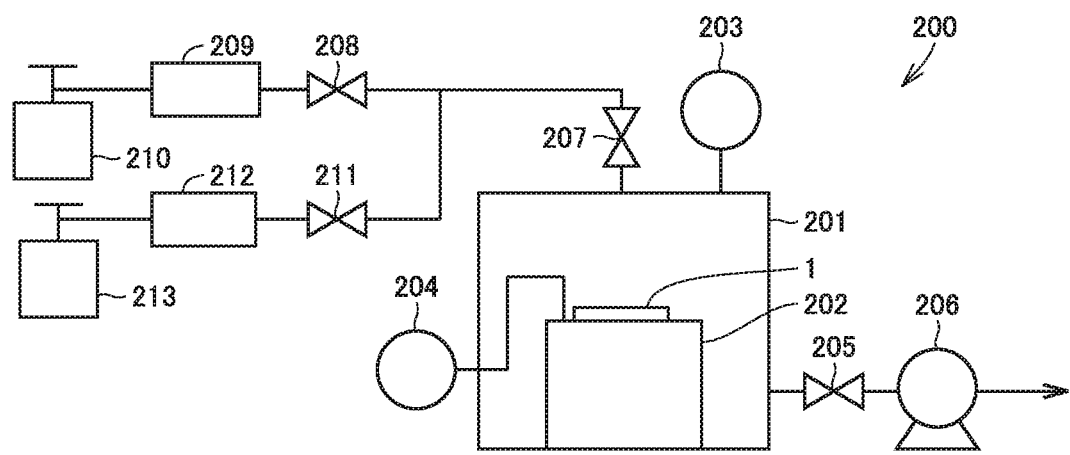
FIG. 11 is a schematic configuration diagram of an etching apparatus for use in the formation of grooves in the cutting method according to the embodiment of the present invention.

As shown in FIG. 11, etching apparatus 200 includes a chamber 201, a stage 202, a manometer 203, a thermometer 204, a valve 205, a vacuum pump 206, a valve 207, a valve 208, a flow rate controller 209, a first gas supply device 210, a valve 211, a flow rate controller 212, and a second gas supply device 213.

In etching apparatus 200, chamber 201 is configured to accommodate workpiece (semiconductor substrate) 1 in which reformed regions 7 have been formed. Workpiece (semiconductor substrate) 1 is placed on stage 202 disposed in chamber 201. Stage 202 is configured to have an adjustable temperature. Stage 202 is heated with workpiece (semiconductor substrate) 1 being placed thereon, causing workpiece (semiconductor substrate) 1 to be heated to a temperature equal to that of stage 202.

Chamber 201 is connected to manometer 203 for measuring the pressure in chamber 201. Stage 202 is connected to thermometer 204 for measuring the temperature of workpiece 1 based on the temperature of stage 202. Thermometer 204 is connected to stage 202, and measures the temperature of stage 202 to thereby measure the temperature of workpiece (semiconductor substrate) 1 that has been heated to the same temperature as stage 202. Chamber 201 is connected by piping to vacuum pump 206 via valve 205. Vacuum pump 206 is a turbo molecular pump or a mechanical booster pump, for example.

Chamber 201 is connected by piping to first gas supply device 210 via valve 207, valve 208 and flow rate controller 209. First gas supply device 210 is configured to supply a first etching gas. Chamber 201 is also connected by piping to second gas supply device 213 via valve 207, valve 211 and flow rate controller 212. Second gas supply device 213 is configured to supply a second etching gas. The second etching gas may be the same as or different from the first etching gas. Valve 205, valve 207, valve 208 and valve 211 are each an electronic regulating valve, for example. Flow rate controllers 209, 212 are each a mass flow meter, for example.

While etching apparatus 200 includes second gas supply device 213 in addition to first gas supply device 210 in FIG. 11, etching apparatus 200 may include only first gas supply device 210. In other words, etching apparatus 200 may include only one gas supply device. Alternatively, etching apparatus 200 may include three or more gas supply devices.

Figure 12:
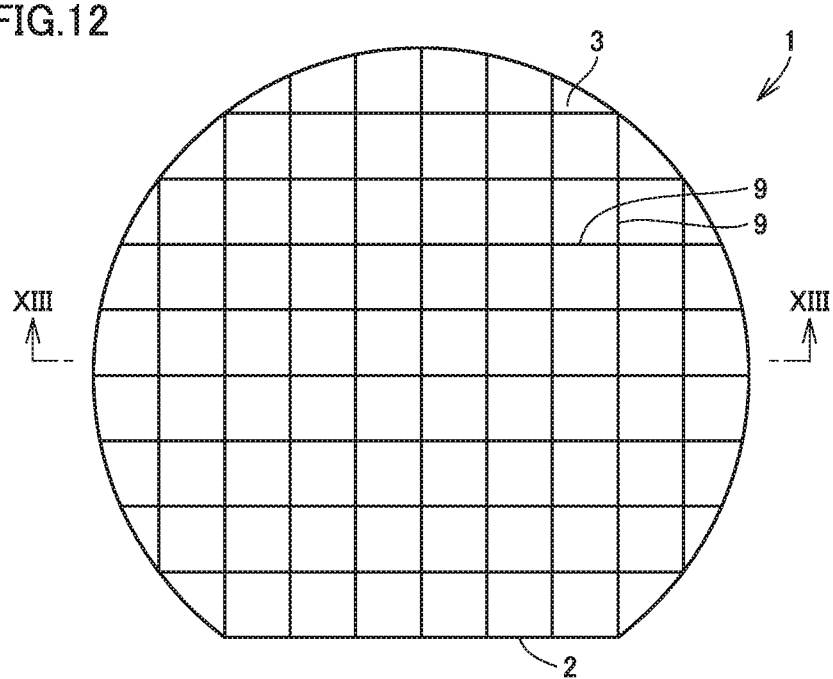
FIG. 12 is a schematic plan view of the workpiece after the grooves have been formed in the cutting method according to the embodiment of the present invention.
Figure 13:
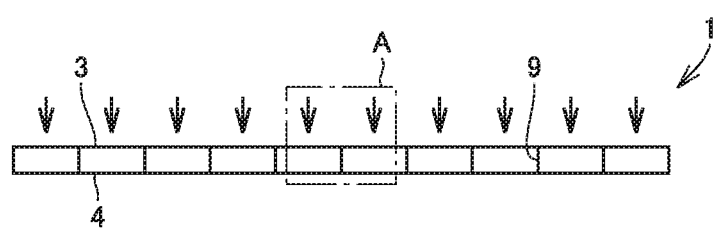
FIG. 13 is a sectional view along the line XIII-XIII in FIG. 12.

As shown in FIGS. 12 and 13, a dry etching process is performed from front surface 3 toward rear surface 4 of workpiece (semiconductor substrate) 1 in etching apparatus 200. The dry etching process is an anisotropic dry etching process using a mixed gas of sulfur hexafluoride ($SF_6$), octafluorocyclobutane ($C_4F_8$) and oxygen ($O_2$), for example. Front surface 3 of workpiece (semiconductor substrate) 1 is thereby etched. Here, in workpiece (semiconductor substrate) 1, reformed region 7 made of polycrystalline silicon, for example, has a higher etching rate than a non-reformed region made of monocrystalline silicon, for example, and therefore, groove 9 is formed in front surface 3 of workpiece (semiconductor substrate) 1 along intended cut line 5. The dry etching process may be performed with a photoresist formed on the functional devices, for example. This photoresist is removed upon completion of the dry etching process.

A pressure-reducing process is also performed in which workpiece (semiconductor substrate) 1 is placed under an atmosphere of reduced pressure as compared to the pressure during the dry etching process. In the pressure-reducing process, vacuum pump 206 operates to evacuate chamber 201. In other words, a vacuum is generated in chamber 201 in the pressure-reducing process. A remaining reaction by-product resulting from the dry etching process is discharged through piping via vacuum pump 206.

Further, referring to FIGS. 14 to 19, the formation of groove 9 is described in detail. FIGS. 14 to 19 correspond to a region A enclosed by a chain-dotted line in FIGS. 10 and 13.

Figure 14:
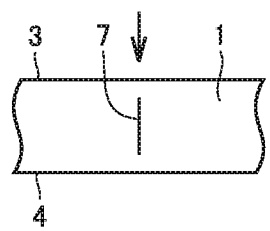
FIG. 14 is an enlarged sectional view of a region A in FIG. 10.
Figure 15:
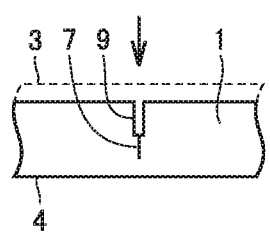
FIG. 15 is an enlarged sectional view illustrating a first dry etching process performed on region A in FIG. 10.

As shown in FIG. 14, after reformed region 7 has been formed in workpiece (semiconductor substrate) 1, groove 9 is formed in workpiece (semiconductor substrate) 1 along intended cut line 5 shown in FIG. 4. As shown in FIG. 15, a first dry etching process is performed on workpiece (semiconductor substrate) 1 from front surface 3 toward rear surface 4 of workpiece (semiconductor substrate) 1. Front surface 3 of workpiece (semiconductor substrate) 1 is etched by the first dry etching process. Further, groove 9 is formed partway into reformed region 7 from front surface 3 toward rear surface 4 of workpiece (semiconductor substrate) 1.

Figure 16:
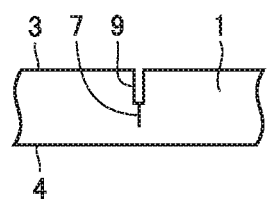
FIG. 16 is an enlarged sectional view illustrating a first pressure-reducing process performed on region A in FIG. 10.

As shown in FIG. 16, after the first dry etching process, a first pressure-reducing process is performed. In the first pressure-reducing process, workpiece (semiconductor substrate) 1 is placed under an atmosphere of reduced pressure as compared to the pressure during the first dry etching process. As a result, a remaining reaction by-product during the first dry etching process is removed from the inside of chamber 201 shown in FIG. 11. Accordingly, the remaining reaction by-product staying in groove 9 formed by the first dry etching process is removed from the inside of groove 9.

Figure 17:
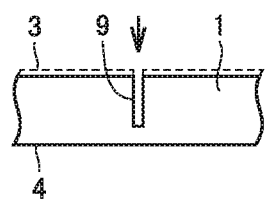
FIG. 17 is an enlarged sectional view illustrating a second dry etching process performed on region A in FIG. 10.

As shown in FIG. 17, after the first pressure-reducing process, a second dry etching process is performed from front surface 3 toward rear surface 4 of workpiece (semiconductor substrate) 1. Front surface 3 of workpiece (semiconductor substrate) 1 is etched by the second dry etching process. Further, groove 9 is formed to the end of reformed region 7 from front surface 3 toward rear surface 4 of workpiece (semiconductor substrate) 1. The second dry etching process may be performed for a longer period of time than the first dry etching process. The second dry etching process may be performed at a higher pressure than the first dry etching process. A sufficient amount of etching gas is thereby allowed to enter the groove formed by the first dry etching process.

Figure 18:
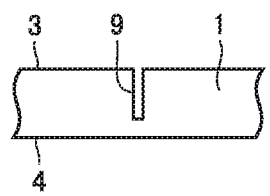
FIG. 18 is an enlarged sectional view illustrating a second pressure-reducing process performed on region A in FIG. 10.

As shown in FIG. 18, after the second dry etching process, a second pressure-reducing process is performed. In the second pressure-reducing process, workpiece 1 is placed under an atmosphere of reduced pressure as compared to the pressure during the second dry etching process. A remaining reaction by-product during the second dry etching process is thereby removed.

Figure 19:
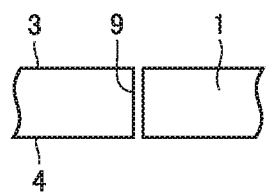
FIG. 19 is an enlarged sectional view illustrating a third dry etching process performed on region A in FIG. 10.

As shown in FIG. 19, after the second pressure-reducing process, a third dry etching process is performed from front surface 3 toward rear surface 4 of workpiece (semiconductor substrate) 1. Front surface 3 of workpiece (semiconductor substrate) 1 is etched by the third dry etching process. Further, groove 9 is formed from front surface 3 to reach rear surface 4 of workpiece 1. In this manner, workpiece (semiconductor substrate) 1 is cut along reformed region 7. Groove 9 may be formed from front surface 3 to reach rear surface 4 of workpiece (semiconductor substrate) 1 by the second dry etching process. In the state shown in FIGS. 12 and 13, the distance between chips formed of workpiece (semiconductor substrate) 1 that has been cut is substantially zero.

Figure 20:
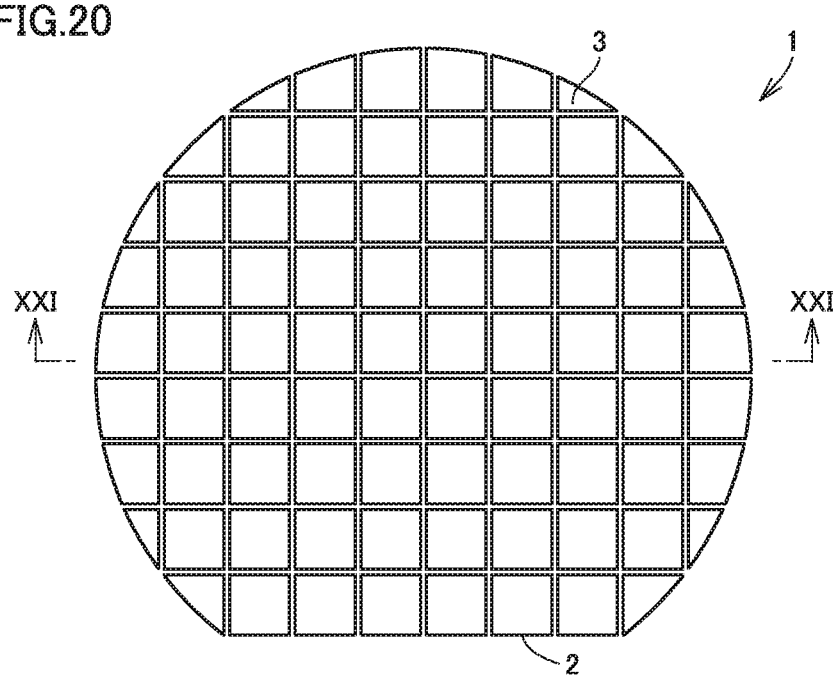
FIG. 20 is a schematic plan view of the workpiece after division.
Figure 21:
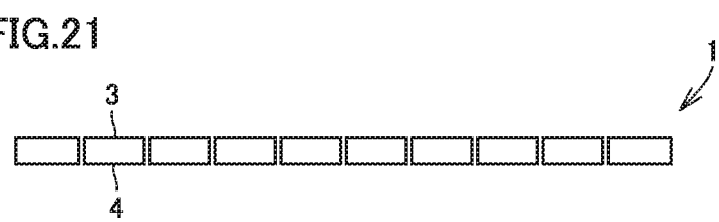
FIG. 21 is a sectional view along the line XXI-XXI in FIG. 20.

Next, referring to FIGS. 20 and 21, workpiece (semiconductor substrate) 1 that has been cut is divided into chips. In other words, the distance between the chips is increased. In the state shown in FIGS. 20 and 21, the distance between the chips is maintained at at least a prescribed distance. The distance between the chips should only be a distance suitable for the next step.

While the dry etching process has been described as being performed three times in the first to third dry etching processes and the pressure-reducing process has been described as being performed twice in the first to second pressure-reducing processes in the description above, the cutting method according to the embodiment of the present invention is not limited to these numbers. The dry etching process should only be performed a plurality of times (twice or more), and the pressure-reducing process should only be performed either a single time (once) or a plurality of times (twice or more).

Figure 22:
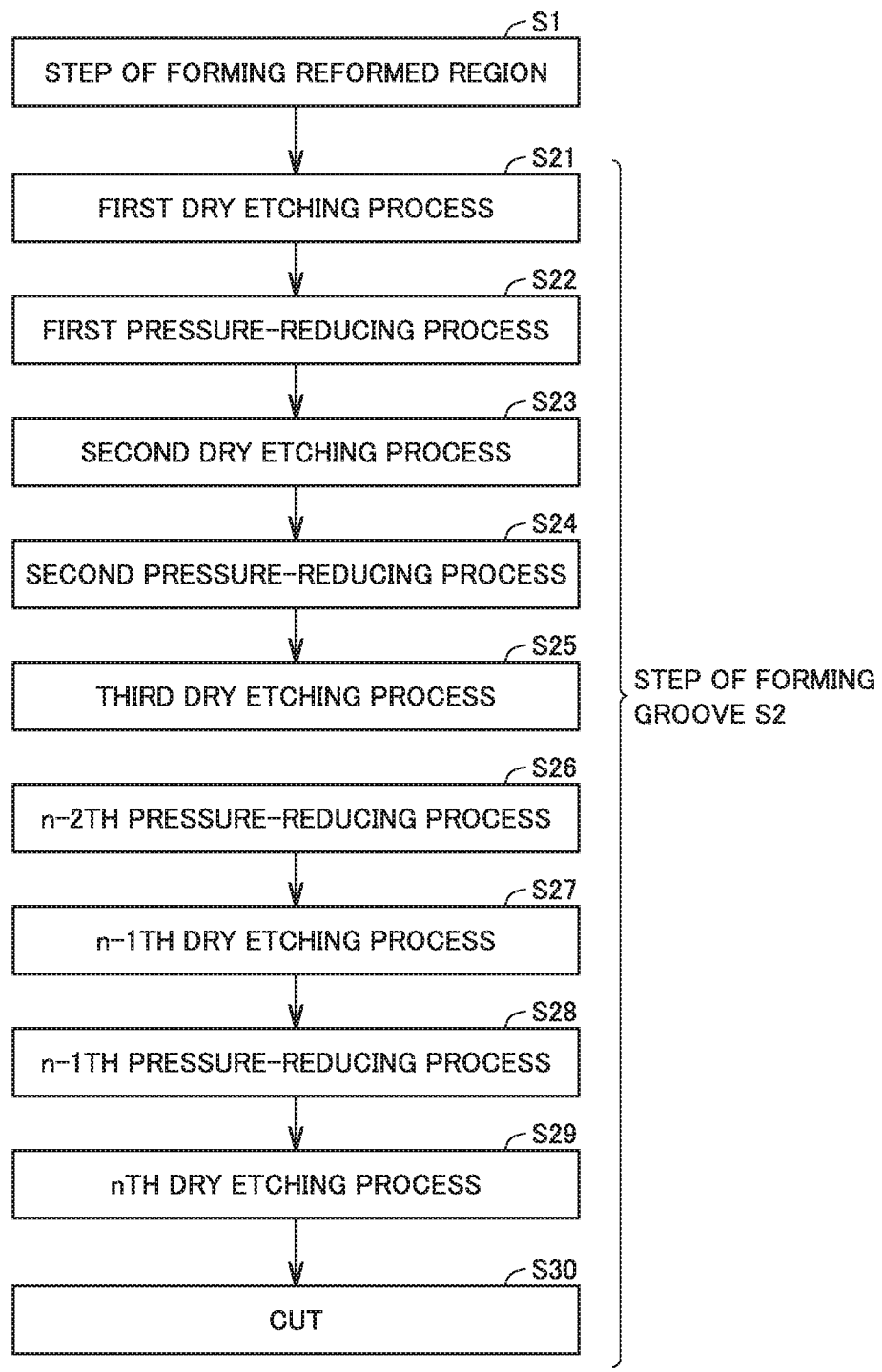
FIG. 22 is a flowchart illustrating the cutting method according to the embodiment of the present invention.

Referring to FIG. 22, as the case where the dry etching process is performed four or more times and the pressure-reducing process is performed three or more times, the case where the dry etching process is performed n times and the pressure-reducing process is performed n−1 times is described. N as used here means an integer of 4 or more.

First, a step of forming a reformed region is performed (step S1). After the reformed region has been formed, a step of forming a groove is performed (step S2). In the step of forming a groove, a first dry etching process (step S21), a first pressure-reducing process (step S22), a second dry etching process (step S23), a second pressure-reducing process (S24), and a third dry etching process (step S25) are successively performed. Then, the n−2th pressure-reducing process (step S26), the n−1th dry etching process (step S27), the n−1th pressure-reducing process (step S28), and the nth dry etching process (step S29) are successively performed. In each pressure-reducing process, the workpiece is placed under an atmosphere of reduced pressure as compared to the pressure during the dry etching process immediately preceding the pressure-reducing process. Once the groove is formed from the front surface to reach the rear surface of the workpiece, the workpiece is cut (step S30).

Next, etching gases for use in the dry etching processes in the cutting method according to the embodiment of the present invention are described in detail.

A halogen-based etching gas may be used for each of the first dry etching process and the second dry etching process. A halogen-based etching gas may be used for each of the first to the nth dry etching processes. The halogen-based etching gas may include at least one of chlorine trifluoride ($ClF_3$), nitrogen trifluoride ($NF_3$), sulfur hexafluoride ($SF_6$), fluorine ($F_2$), chlorine ($Cl_2$), hydrogen bromide (HBr), carbon tetrafluoride ($CF_4$), octafluorocyclobutane ($C_4F_8$), methane trifluoride ($CHF_3$) and boron trichloride ($BCl_3$). In other words, the halogen-based etching gas may be either a single gas or a mixed gas including these materials. The halogen-based etching gas may be a mixed gas of octafluorocyclobutane ($C_4F_8$) and oxygen ($O_2$), for example.

Next, function and effect of the cutting method according to the embodiment of the present invention will be described.

According to the cutting method in the embodiment of the present invention, after reformed region 7 has been formed in workpiece (semiconductor substrate) 1, groove 9 is formed in workpiece (semiconductor substrate) 1 along intended cut line 5. In the step of forming groove 9, utilizing the fact that reformed region 7 has a higher etching rate than a non-reformed region, the first dry etching process is performed to form groove 9 in workpiece (semiconductor substrate) 1 along intended cut line 5. After the first dry etching process, the first pressure-reducing process is performed to discharge the remaining reaction by-product. After the first pressure-reducing process, the second dry etching process is performed to allow the etching gas to readily enter groove 9 formed in the first dry etching process. As a result, the etching rate in the second dry etching process can be improved.

Namely, when a common dry etching process is performed after reformed region 7 has been formed, the pressure in the chamber is maintained constant, causing a decrease in the etching rate due to the remaining reaction by-product. In contrast, in the cutting method according to the embodiment of the present invention, the second dry etching process is performed after the remaining reaction by-product produced by performing the first dry etching process has been discharged from groove 9 and the inside of chamber 201 by performing the first pressure-reducing process, to thereby allow the etching gas to readily enter groove 9 formed in the first dry etching process. Therefore, the etching rate can be improved as compared to when a common dry etching process is performed.

According to the cutting method in the embodiment of the present invention, in the step of forming groove 9, groove 9 may be formed from the front surface to reach the rear surface of workpiece 1, to cause cutting of workpiece 1 along intended cut line 5. The etching rate can be improved, to thereby allow quick cutting of workpiece 1.

According to the cutting method in the embodiment of the present invention, in the step of forming groove 9, the second pressure-reducing process is performed after the second dry etching process, to thereby discharge the remaining reaction by-product. The third dry etching process is performed after the second pressure-reducing process, to thereby allow the etching gas to readily enter groove 9 formed in the second dry etching process. In addition, groove 9 can be formed by performing a cycle of dry etching process, pressure-reducing process and dry etching process a plurality of times. Accordingly, the etching rate can be further improved.

According to the cutting method in the embodiment of the present invention, a halogen-based etching gas can be used for each of the first dry etching process and the second dry etching process.

According to the cutting method in the embodiment of the present invention, as the halogen-based etching gas, at least one of chlorine trifluoride ($ClF_3$), nitrogen trifluoride ($NF_3$), sulfur hexafluoride ($SF_6$), fluorine ($F_2$), chlorine ($Cl_2$), hydrogen bromide (HBr), carbon tetrafluoride ($CF_4$), octafluorocyclobutane ($C_4F_8$), methane trifluoride ($CHF_3$) and boron trichloride ($BCl_3$) can be used.

According to the cutting method in the embodiment of the present invention, in the step of forming reformed region 7 in workpiece 1, reformed region 7 may be formed in such a manner that a state of formation of reformed region 7 on the front surface side and a state of formation of reformed region 7 on the rear surface side are substantially identical. As a result, reformed region 7 can be uniformly etched from the front surface side and the rear surface side of workpiece 1.

Figure 23:
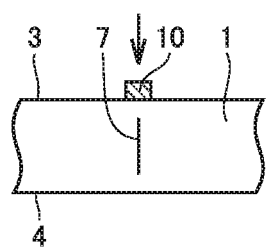
FIG. 23 is a schematic sectional view of a TEG formation region in the workpiece after laser processing in the cutting method according to the embodiment of the present invention.
Figure 24:
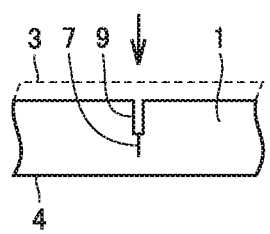
FIG. 24 is an enlarged sectional view illustrating a first dry etching process performed on the TEG formation region in FIG. 23.

Next, various variations of the cutting method according to the embodiment of the present invention are described. A first variation of the cutting method according to the embodiment of the present invention is described first. As the first variation, referring to FIGS. 23 and 24, a TEG (Test Element Group) 10 may be formed on the intended cut line of workpiece (semiconductor substrate) 1. In this case, at least one of tungsten (W), titanium (Ti), titanium nitride (TiN) and molybdenum (Mo) may be used as a material for TEG 10. In other words, in this case, workpiece (semiconductor substrate) 1 includes the substrate body, the functional devices (not shown) and TEG 10.

Therefore, the material for workpiece 1 may include at least one of silicon (Si), tungsten (W), titanium (Ti), titanium nitride (TiN) and molybdenum (Mo). In this case, in the step of forming groove 9, the first dry etching process and the second dry etching process may be performed using a plasmaless chlorine trifluoride ($ClF_3$) gas as the halogen-based etching gas, at a pressure of not less than 10 Pa and not more than 90 kPa (abs) and at a temperature of not less than the boiling point of each fluoride in the material and less than 200° C. Referring again to FIG. 11, this pressure is the pressure in chamber 201. This temperature is the temperature of workpiece 1.

The pressure is set to not less than 10 Pa because the etching rate decreases due to a decrease in etching reaction rate when the pressure is less than 10 Pa. The pressure is set to not less than 10 Pa also because it takes time to set the pressure to less than 10 Pa using vacuum pump 206. The pressure is set to not less than 10 Pa also because the amount of the remaining reaction by-product discharged from groove 9 when the pressure is set to less than 10 Pa remains substantially unchanged from the amount when the pressure is set to 10 Pa. The pressure is set to not less than 10 Pa also because a mechanical booster pump, not a turbo molecular pump, can be used to set the pressure to 10 Pa. The pressure is set to not more than 90 kPa because it is difficult to set the pressure to higher than 90 kPa in a vacuum device. With the plasmaless chlorine trifluoride ($ClF_3$) gas, the etching can be performed over a pressure range of not less than 10 Pa and not more than 90 kPa (abs). For this reason, the range of pressure is set to not less than 10 Pa and not more than 90 kPa (abs). The chlorine trifluoride ($ClF_3$) gas can etch silicon (Si), tungsten (W), titanium (Ti), titanium nitride (TiN) and molybdenum (Mo). For this reason, silicon (Si), tungsten (W), titanium (Ti), titanium nitride (TiN) and molybdenum (Mo) are used as the material for workpiece 1. The temperature is set to not less than the boiling point of each fluoride in the material for workpiece 1 because the etching rate in each material can be ensured by such setting. The temperature is set to less than 200° C. because a maximum temperature during dicing of the devices formed on workpiece 1 is 200° C.

In the first variation of the cutting method according to the embodiment of the present invention, the material for workpiece 1 may include at least one of silicon (Si), tungsten (W), titanium (Ti), titanium nitride (TiN) and molybdenum (Mo). In this case, in the step of forming groove 9, the first dry etching process and the second dry etching process may be performed using a plasmaless chlorine trifluoride ($ClF_3$) gas as the halogen-based etching gas, at a pressure of not less than 10 Pa and not more than 90 kPa (abs) and at a temperature of not less than the boiling point of each fluoride in the material and less than 200° C. As a result, workpiece 1 including at least one of silicon (Si), tungsten (W), titanium (Ti), titanium nitride (TiN) and molybdenum (Mo) can be etched.

Next, a second variation of the cutting method according to the embodiment of the present invention is described. As the second variation, an insulating film may be formed on the intended cut line of the workpiece. In this case, at least one of silicon dioxide ($SiO_2$), silicon oxynitride (SiON) and silicon nitride (SiNx) may be used as a material for the insulating film. It should be noted that SiNx may vary in composition ratio (x) around $Si_3N_4$ in which a ratio of the number of atoms (composition) forming a SiN compound exists according to the chemical formula. The value of x may be not less than 1.0 and not more than 1.5, for example. In this case, the workpiece (semiconductor substrate) includes the substrate body, the functional devices and the insulating film.

Therefore, the material for the workpiece may include at least one of silicon dioxide ($SiO_2$), silicon oxynitride (SiON) and silicon nitride (SiNx). In this case, in the step of forming the groove, the first dry etching process and the second dry etching process may be performed with anhydrous hydrogen fluoride (HF) added to the halogen-based etching gas. The etching gas including anhydrous hydrogen fluoride (HF) added to the halogen-based etching gas can etch silicon dioxide ($SiO_2$), silicon oxynitride (SiON) and silicon nitride (SiNx). For this reason, the etching gas includes anhydrous hydrogen fluoride (HF) added to the halogen-based etching gas.

In the second variation of the cutting method according to the embodiment of the present invention, the material for the workpiece may include at least one of silicon dioxide ($SiO_2$), silicon oxynitride (SiON) and silicon nitride (SiNx). In this case, in the step of forming the groove, the first dry etching process and the second dry etching process may be performed with anhydrous hydrogen fluoride (HF) added to the halogen-based etching gas. As a result, workpiece 1 including at least one of silicon dioxide ($SiO_2$), silicon oxynitride (SiON) and silicon nitride (SiNx) can be etched.

In the plurality of plasmaless dry etching processes in the first variation and the second variation of the cutting method according to the embodiment of the present invention described above, volume density of gas molecules may be varied within a range of not less than 10 times and not more than 10000 times as compared to volume density during the pressure-reducing process immediately preceding each dry etching process.

Next, a third variation of the cutting method according to the embodiment of the present invention is described. As the third variation, a TEG and an insulating film may be formed on the intended cut line of the workpiece. In this case, at least one of tungsten (W), titanium (Ti), titanium nitride (TiN) and molybdenum (Mo) may be used as a material for the TEG, and at least one of silicon dioxide ($SiO_2$), silicon oxynitride (SiON) and silicon nitride (SiNx) may be used as a material for the insulating film.

Therefore, the material for the workpiece may include at least one of silicon (Si), tungsten (W), titanium (Ti), titanium nitride (TiN), molybdenum (Mo), silicon dioxide ($SiO_2$), silicon oxynitride (SiON) and silicon nitride (SiNx). In this case, in the step of forming the groove, the first dry etching process and the second dry etching process may be performed using at least one of carbon tetrafluoride ($CF_4$), sulfur hexafluoride ($SF_6$), methane trifluoride ($CHF_3$), hydrogen fluoride (HF) and oxygen ($O_2$) in a plasma state as the etching gas, at a pressure of not less than 10 Pa and not more than 0.8 kPa (abs) and at a temperature of less than 200° C. This pressure is the pressure in the chamber. This temperature is the temperature of the workpiece.

The carbon tetrafluoride ($CF_4$), sulfur hexafluoride ($SF_6$), methane trifluoride ($CHF_3$), hydrogen fluoride (HF) and oxygen ($O_2$) in a plasma state can etch silicon (Si), tungsten (W), titanium (Ti), titanium nitride (TiN), molybdenum (Mo), silicon dioxide ($SiO_2$), silicon oxynitride (SiON) and silicon nitride (SiNx). For this reason, silicon (Si), tungsten (W), titanium (Ti), titanium nitride (TiN), molybdenum (Mo), silicon dioxide ($SiO_2$), silicon oxynitride (SiON) and silicon nitride (SiNx) are used as the material for the workpiece. The pressure is set to not more than 0.8 kPa (abs) because maximum output in remote plasma has a pressure of 0.8 kPa.

In the third variation of the cutting method according to the embodiment of the present invention, the material for the workpiece may include at least one of silicon (Si), tungsten (W), titanium (Ti), titanium nitride (TiN), molybdenum (Mo), silicon dioxide ($SiO_2$), silicon oxynitride (SiON) and silicon nitride (SiNx). In this case, in the step of forming the groove, the first dry etching process and the second dry etching process may be performed using at least one of carbon tetrafluoride ($CF_4$), sulfur hexafluoride ($SF_6$), methane trifluoride ($CHF_3$), hydrogen fluoride (HF) and oxygen ($O_2$) in a plasma state as the etching gas, at a pressure of not less than 10 Pa and not more than 0.8 kPa (abs) and at a temperature of less than 200° C. As a result, the workpiece including at least one of silicon (Si), tungsten (W), titanium (Ti), titanium nitride (TiN), molybdenum (Mo), silicon dioxide ($SiO_2$), silicon oxynitride (SiON) and silicon nitride (SiNx) can be etched.

Next, a fourth variation of the cutting method according to the embodiment of the present invention is described. As the fourth variation, an aluminum film and a TEG may be formed on the intended cut line of the workpiece. In this case, aluminum (Al) may be used as a material for the aluminum film, and at least one of tungsten (W), titanium (Ti), titanium nitride (TiN) and molybdenum (Mo) may be used as a material for the TEG.

Therefore, the material for the workpiece may include at least one of aluminum (Al), silicon (Si), tungsten (W), titanium (Ti), titanium nitride (TiN) and molybdenum (Mo). In this case, in the step of forming the groove, the first dry etching process and the second dry etching process may be performed using at least one of chlorine ($Cl_2$), hydrogen bromide (HBr), hydrogen chloride (HCl) and boron trichloride ($BCl_3$) in a plasma state as the etching gas, at a pressure of not less than 10 Pa and not more than 0.8 kPa (abs) and at a temperature of less than 200° C. This pressure is the pressure in the chamber. This temperature is the temperature of the workpiece.

The chlorine ($Cl_2$), hydrogen bromide (HBr), hydrogen chloride (HCl) and boron trichloride ($BCl_3$) in a plasma state can etch aluminum (Al), silicon (Si), tungsten (W), titanium (Ti), titanium nitride (TiN) and molybdenum (Mo). For this reason, aluminum (Al), silicon (Si), tungsten (W), titanium (Ti), titanium nitride (TiN) and molybdenum (Mo) are used as the material for the workpiece.

In the fourth variation of the cutting method according to the embodiment of the present invention, the material for the workpiece includes at least one of aluminum (Al), silicon (Si), tungsten (W), titanium (Ti), titanium nitride (TiN) and molybdenum (Mo). In the step of forming the groove, the first dry etching process and the second dry etching process may be performed using at least one of chlorine ($Cl_2$), hydrogen bromide (HBr), hydrogen chloride (HCl) and boron trichloride ($BCl_3$) in a plasma state as the etching gas, at a pressure of not less than 10 Pa and not more than 0.8 kPa (abs) and at a temperature of less than 200° C. As a result, the workpiece including at least one of aluminum (Al), silicon (Si), tungsten (W), titanium (Ti), titanium nitride (TiN) and molybdenum (Mo) can be etched.

In the plurality of dry etching processes in plasma discharge in the third variation and the fourth variation of the cutting method according to the embodiment of the present invention described above, the pressure may be varied within a range of not less than 10% and not more than 100% as compared to during the pressure-reducing process immediately preceding each dry etching process.

In the case of downstream plasma processing in which a gas discharge space and a substrate-installed space are partitioned by a discharging pressure control valve, pressure in the substrate-installed space may be varied within a range of not less than 1/10 and not more than 1/10000 of pressure in the gas discharge space, while the discharge pressure is maintained constant.

It should be understood that the embodiments disclosed herein are illustrative and non-restrictive in every respect. The scope of the present invention is defined by the terms of the claims, not by the description above, and is intended to include any modifications within the meaning and scope equivalent to the terms of the claims.

REFERENCE SIGNS LIST 1 workpiece; 3 front surface; 4 rear surface; 5 intended cut line; 7 reformed region; 9 groove; 100 laser processing apparatus; 200 etching apparatus; 201 chamber; 202 stage; 203 manometer; 204 thermometer; 205, 207, 208, 211 valve; 206 vacuum pump; 209, 212 flow rate controller; 210 first gas supply device; 213 second gas supply device.

The invention claimed is:

1. A cutting method for cutting a workpiece in a form of a plate along an intended cut line, the cutting method comprising:
   forming a reformed region in the workpiece along the intended cut line, by applying a laser beam while positioning a point of condensation in the workpiece; and
   after forming the reformed region in the workpiece, forming a groove in the workpiece along the intended cut line,
   in the forming a groove,
      a first dry etching process being performed from a front surface toward a rear surface of the workpiece,
      after the first dry etching process, a first pressure-reducing process being performed in which the workpiece is placed under an atmosphere of reduced pressure as compared to pressure during the first dry etching process, and
      after the first pressure-reducing process, a second dry etching process being performed from the front surface toward the rear surface of the workpiece.

2. The cutting method according to claim 1, wherein
   in the forming a groove, the groove is formed from the front surface to reach the rear surface of the workpiece, to cause cutting of the workpiece along the intended cut line.

3. The cutting method according to claim 1, wherein
   in the forming a groove,
      after the second dry etching process, a second pressure-reducing process is performed in which the workpiece is placed under an atmosphere of reduced pressure as compared to pressure during the second dry etching process, and
      after the second pressure-reducing process, a third dry etching process is performed from the front surface toward the rear surface of the workpiece.

4. The cutting method according to claim 1, wherein
   in the forming a groove, a halogen-based etching gas is used for each of the first dry etching process and the second dry etching process.

5. The cutting method according to claim 4, wherein
   the halogen-based etching gas includes at least one of chlorine trifluoride, nitrogen trifluoride, sulfur hexafluoride, fluorine, chlorine, hydrogen bromide, carbon tetrafluoride, octafluorocyclobutane, methane trifluoride, and boron trichloride.

6. The cutting method according to claim 5, wherein
   a material for the workpiece includes at least one of silicon, tungsten, titanium, titanium nitride and molybdenum, and
   in the forming a groove, the first dry etching process and the second dry etching process are performed using a plasmaless chlorine trifluoride gas as the halogen-based etching gas, at a pressure of not less than 10 Pa and not more than 90 kPa (abs) and at a temperature of not less than a boiling point of each fluoride in the material and less than 200° C.

7. The cutting method according to claim 6, wherein
the material for the workpiece includes at least one of silicon dioxide, silicon oxynitride and silicon nitride, and
in the forming a groove, the first dry etching process and the second dry etching process are performed with anhydrous hydrogen fluoride added to the halogen-based etching gas.

8. The cutting method according to claim 1, wherein
a material for the workpiece includes at least one of silicon, tungsten, titanium, titanium nitride, molybdenum, silicon dioxide, silicon oxynitride and silicon nitride, and
in the forming a groove, the first dry etching process and the second dry etching process are performed using at least one of carbon tetrafluoride, sulfur hexafluoride, methane trifluoride, hydrogen fluoride and oxygen in a plasma state as an etching gas, at a pressure of not less than 10 Pa and not more than 0.8 kPa (abs) and at a temperature of less than 200° C.

9. The cutting method according to claim 1, wherein
a material for the workpiece includes at least one of aluminum, silicon, tungsten, titanium, titanium nitride and molybdenum, and
in the forming a groove, the first dry etching process and the second dry etching process are performed using at least one of chlorine, hydrogen bromide, hydrogen chloride and boron trichloride in a plasma state as an etching gas, at a pressure of not less than 10 Pa and not more than 0.8 kPa (abs) and at a temperature of less than 200° C.

10. The cutting method according to claim 1, wherein
in the forming a reformed region in the workpiece, the reformed region is formed in such a manner that a state of formation of the reformed region on the front surface side and a state of formation of the reformed region on the rear surface side are substantially identical.

11. The cutting method according to claim 1, wherein
in the forming a reformed region in the workpiece, the reformed region is formed within the workpiece away from an outer surface of the workpiece.

12. The cutting method according to claim 1, wherein
the first pressure-reducing process removes a by-product that is formed during the first dry etching process.

* * * * *